United States Patent
Lee et al.

(10) Patent No.: US 9,142,294 B2
(45) Date of Patent: Sep. 22, 2015

(54) NONVOLATILE RESISTIVE MEMORY DEVICE AND WRITING METHOD

(71) Applicants: Yong-Kyu Lee, Hwaseong-Si (KR); Bo-Geun Kim, Suwon-Si (KR)

(72) Inventors: Yong-Kyu Lee, Hwaseong-Si (KR); Bo-Geun Kim, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 233 days.

(21) Appl. No.: 13/797,089

(22) Filed: Mar. 12, 2013

(65) Prior Publication Data

US 2014/0204650 A1 Jul. 24, 2014

(30) Foreign Application Priority Data

Jan. 21, 2013 (KR) .................... 10-2013-0006568

(51) Int. Cl.
*G11C 13/00* (2006.01)
*G11C 11/56* (2006.01)

(52) U.S. Cl.
CPC ........ *G11C 13/0069* (2013.01); *G11C 11/5678* (2013.01); *G11C 13/0004* (2013.01); *G11C 2013/0078* (2013.01); *G11C 2013/0092* (2013.01); *G11C 2213/71* (2013.01); *G11C 2213/72* (2013.01)

(58) Field of Classification Search
CPC ........................... G11C 16/28; G11C 13/0069
USPC ................. 365/148, 185.21, 185.01
See application file for complete search history.

(56) References Cited

U.S. PATENT DOCUMENTS

| | | | |
|---|---|---|---|
| 7,573,758 B2 | 8/2009 | Park et al. | |
| 8,068,361 B2 | 11/2011 | Kang et al. | |
| 8,116,117 B2 | 2/2012 | Cho et al. | |
| 2010/0097842 A1 | 4/2010 | Hwang | |
| 2010/0254178 A1 | 10/2010 | Tsushima et al. | |
| 2010/0254188 A1 | 10/2010 | Ohsuk et al. | |
| 2010/0328988 A1 * | 12/2010 | Nagashima et al. | 365/148 |
| 2011/0161571 A1 | 6/2011 | Kim et al. | |
| 2012/0120730 A1 | 5/2012 | Kang et al. | |
| 2012/0127791 A1 | 5/2012 | Lee | |
| 2012/0127802 A1 | 5/2012 | Choi | |

* cited by examiner

*Primary Examiner* — Huan Hoang
*Assistant Examiner* — Minh Dinh
(74) *Attorney, Agent, or Firm* — Volentine & Whitt, PLLC

(57) ABSTRACT

A writing method for a resistive nonvolatile memory device includes writing data to a resistive nonvolatile memory cell using an up/down write pulse signal when the data is first data type, and writing data to the resistive nonvolatile memory cell using only one of an up write pulse signal and a down write pulse signal when the data is second data type.

20 Claims, 14 Drawing Sheets

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

| SA/WD(2_1) | SA/WD(2_2) | SA/WD(2_3) | SA/WD(2_4) |
|---|---|---|---|

| PERIPHERY(3) |
|---|

| SA/WD(2_8) | SA/WD(2_7) | SA/WD(2_6) | SA/WD(2_5) |
|---|---|---|---|

| BLK7 | BLK7 | BLK7 | BLK7 | BLK7 | BLK7 | BLK7 | BLK7 |
|---|---|---|---|---|---|---|---|
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

NONVOLATILE RESISTIVE MEMORY DEVICE AND WRITING METHOD

CROSS-REFERENCE TO RELATED APPLICATION

This application claims priority under 35 U.S.C. 119 to Korean Patent Application No. 10-2013-0006568 filed Jan. 21, 2013, the subject matter of which is hereby incorporated by reference.

BACKGROUND

The inventive concept relates to nonvolatile memory devices and writing methods for nonvolatile memory devices. More particularly, the inventive concept relates to resistive nonvolatile memory devices and writing methods for resistive nonvolatile memory devices.

Volatile memory cells, like those used in dynamic random access memory (DRAM), as well as certain nonvolatile memory cells, like those used in flash memory, store data in accordance with a characteristic electrical charge. In contrast, other nonvolatile memory cells store data in accordance with a characteristic resistance that may be varied and detected by applying certain control signals (e.g., voltage(s) and/or current(s)). Nonvolatile memory devices that incorporate resistance-variable nonvolatile memory cells include, at least; phase-change random access memory (PRAM), resistive random access memory (RRAM), and magnetic random access memory (MRAM).

PRAM typically uses one or more phase-changeable material(s), such as chalcogenide alloy, to indicate a stored data state. RRAM typically uses one or more resistance-changeable elements, such as a magnetic tunnel junction (MTJ) thin film, to indicate a stored data state, and MRAM typically uses the magnetization properties of a ferromagnetic material to indicate a stored data state.

More particularly, the phase-change material of a PRAM may be placed into a crystalline state or an amorphous state by the carefully timed application of heat inducing control signals, wherein the crystalline state of the phase-change material—commonly interpreted as a set (or "0" value) data state—exhibits a relatively low resistance, while the amorphous state of the phase-change material—commonly interpreted as a reset (or "1" value) data state—exhibits a relatively high resistance.

The sequence of operative steps generating and applying control signals to a selected group of one or more nonvolatile memory cells in order to define one or more data states to be stored by the nonvolatile memory cells may be termed a "writing" method. The typical object of a writing method directed to a resistance-variable, nonvolatile memory cell is one in which the characteristic resistance manifest by the memory cell is placed within a defined resistance distribution (e.g., a range of resistances extending from a lower limit to an upper limit). Effective writing methods must balance the accuracy with which nonvolatile memory cells are written with the time required to execute the writing method.

SUMMARY

Embodiments of the inventive concept generally provide writing methods for nonvolatile memory devices having improved overall execution operating speed while maintaining acceptable data writing accuracy.

According to an aspect of the inventive concept, a writing method for a resistive nonvolatile memory device, comprises; writing data to at least one resistive nonvolatile memory cell using an up/down write pulse signal when the data is first data type, and writing data to the at least one resistive nonvolatile memory cell using only one of an up write pulse signal and a down write pulse signal when the data is second data type.

BRIEF DESCRIPTION OF THE DRAWINGS

The above and other features and advantages of the inventive concept will become more apparent upon consideration of certain embodiments thereof with reference to the attached drawings in which:

FIG. 1 is a block diagram illustrating a memory cell array of a nonvolatile memory according to certain embodiments of the inventive concept;

DETAILED DESCRIPTION

Figure 2:
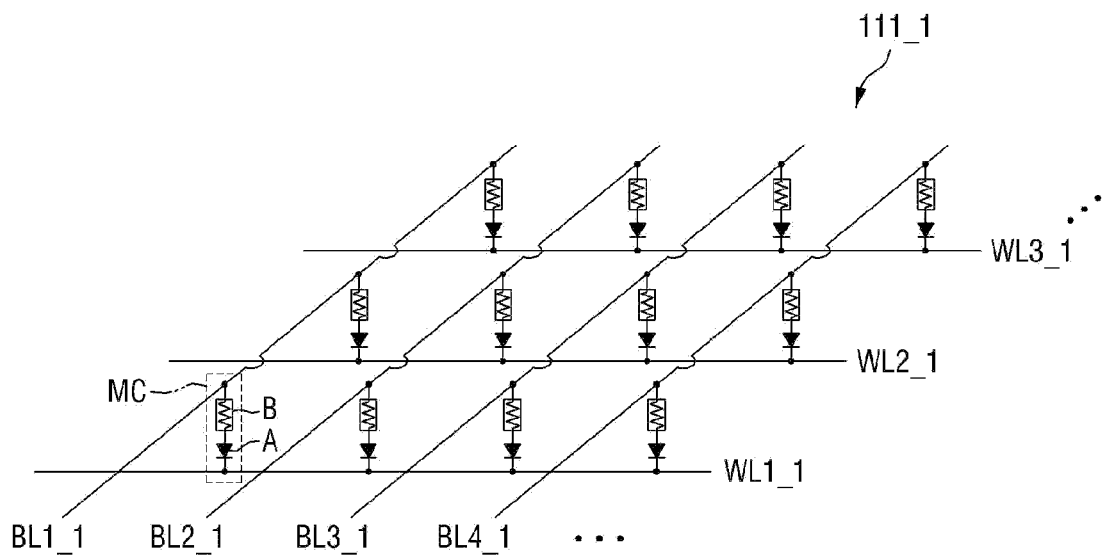
FIGS. 2 and 3 are diagrams further illustrating the memory cell array of FIG. 1.

Advantages and features of the inventive concept and methods of accomplishing the same may be understood more readily by reference to the following detailed description of embodiments in conjunction with the accompanying drawings. The inventive concept may, however, be embodied in many different forms and should not be construed as being limited to only the illustrated embodiments. Rather, these embodiments are provided so that this disclosure will be thorough and complete and will fully convey the concept of the inventive concept to those skilled in the art. The scope of the inventive concept is defined by the appended claims. Throughout the written description and drawings similar numbers and labels are used to denote like or similar elements and features.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without substantially changing the meaning or scope of the disclosure.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Hereinafter, exemplary embodiments of the inventive concept will be described in the context of a phase-change random access memory (PRAM). However, those skilled in the art will recognize that the inventive concept subsumes all types of nonvolatile memories using resistance-variable memory cells, such as RRAM and MRAM.

Figure (FIG. 1 is a block diagram illustrating an exemplary memory cells array for a nonvolatile memory device according to certain embodiments of the inventive concept. For simplicity of description, the nonvolatile memory cell array of FIG. 1 is assumed to include sixteen (16) memory banks (1-1 through 1-16).

Referring to FIG. 1, the nonvolatile memory device comprises an array of nonvolatile memory cells logically divided into a memory banks (e.g., 16) and further logically divided into memory blocks (e.g., 8 per bank—BLK0 to BLK7). A plurality of sense amplifiers and write drivers (SA/WD) (2_1 through 2_8) are arranged at the head of two (2) adjacent memory banks around a peripheral circuit region 3.

Although not shown in FIG. 1, conventionally understood row selection circuitry, column selection circuitry, power generation, logic circuitry, and control circuitry may be operatively provided in relation to the nonvolatile memory cell array in various embodiments of the inventive concept. In certain embodiments, one or more of such circuitry may be provided in the periphery circuit area 3.

The sense amplifiers and write drivers (SA/WD) 2_1 to 2_8 are arranged in relation to two (2) adjacent memory banks in a conventionally understood manner to execute read and write operations directed to the corresponding memory banks. In the illustrated embodiment of FIG. 1, the sense amplifiers and write drivers (SA/WD) 2_1 to 2_8 arranged corresponding to two of the memory banks 1_1 to 1_16 are illustrated by way of example, but aspects of the inventive concept are not limited thereto. That is to say, the sense amplifiers and write drivers (SA/WD) 2_1 to 2_8 may be arranged in corresponding relationship to one (1) or four (4) memory banks, as further examples of configurations contemplated by certain embodiments of the inventive concept.

FIG. 2 further illustrates one possible example of the memory cell array of FIG. 1 having a so-called cross point structure. Here, the term "cross point structure" means a structure in which one memory cell is formed at an intersection between a first line (e.g., a word line) and a second line (e.g., a bit line). In the illustrated example, bit lines BL1_1 to BL4_1 extend in a first direction, and word lines WL1_1 to WL3_1 extend in a second direction crossing the bit lines BL1_1 to BL4_1. Memory cells (MC) are formed at respective intersections between the bit lines BL1_1 to BL4_1 and the word lines WL1_1 to WL3_1. Each of the nonvolatile memory cells MC is further assumed to have a variable resistive element B connected in series with an access element A controlling the electrical current flowing through the variable resistive element B.

Figure 3:
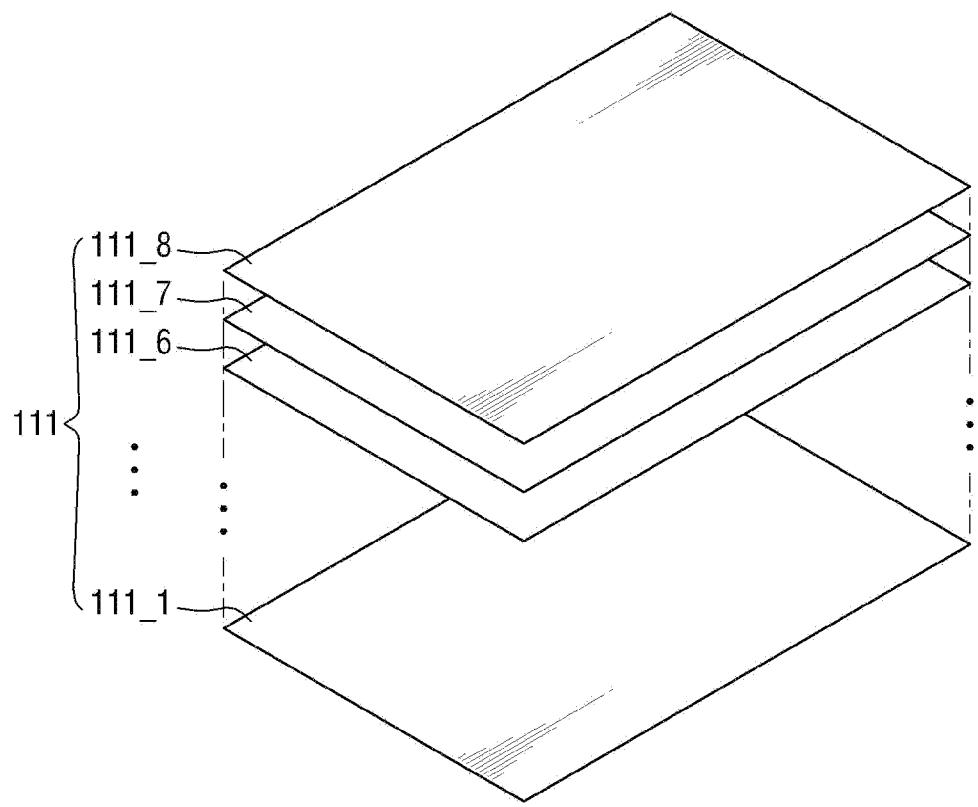

FIG. 3 further illustrates another possible aspect of the nonvolatile memory cell array of FIG. 1. Namely, the nonvolatile memory cell array may be implemented as a three-dimensional (3D) (or vertically stacked) structure. Here, the term "vertical" is an arbitrarily assumed direction relative to a base substrate or printed circuit board supporting the nonvolatile memory cell array. In FIG. 3, eight memory cell layers 111_1 to 111_8 are vertically stacked, but other embodiments may include more or less layers. Each memory cell layers 111_1 to 111_8 may include multiple memory cell groups and/or multiple redundancy memory cell groups. When a nonvolatile memory cell array has a 3D structure, each of the constituent memory cell layers may have the cross point structure shown in FIG. 2, but other memory cell configurations might alternately be used.

Figure 4:
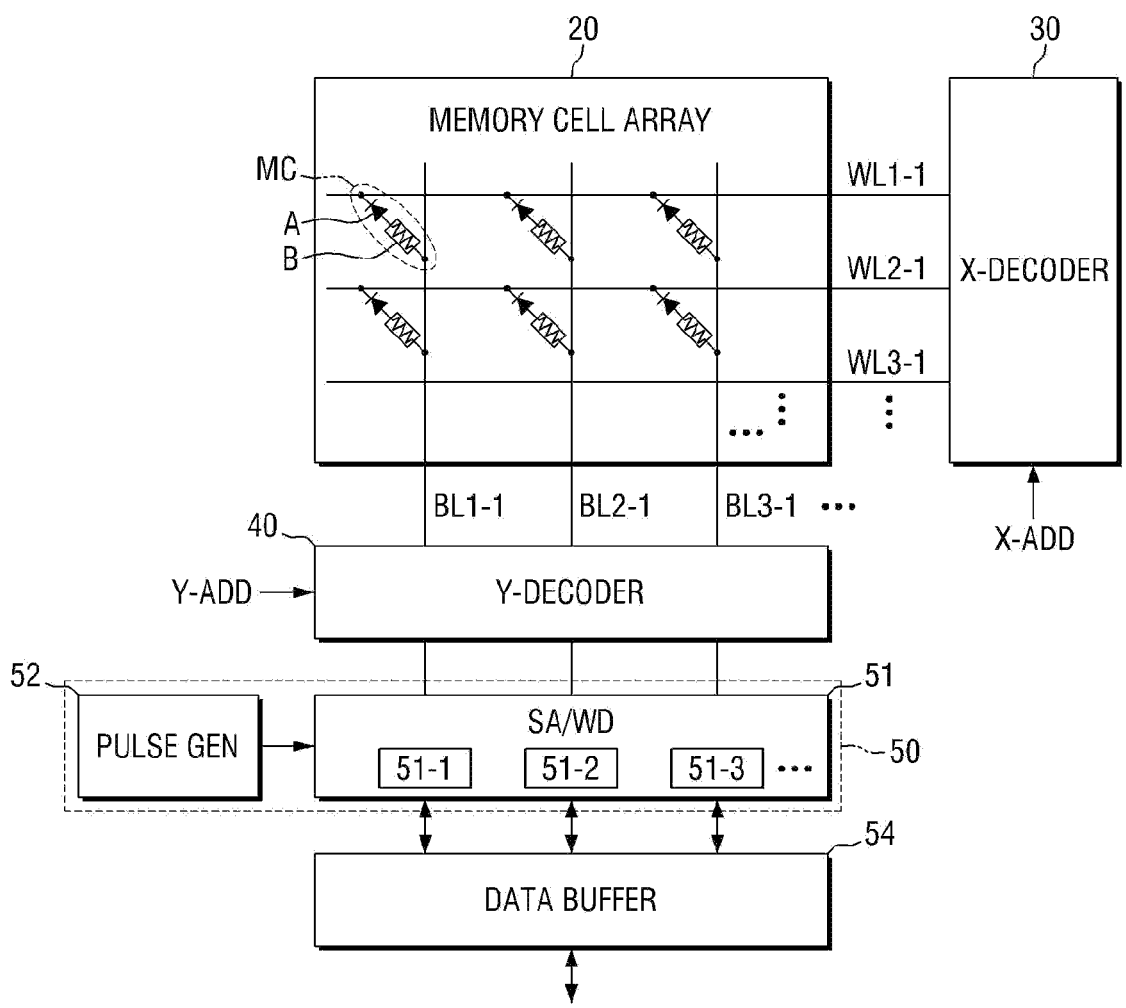
FIG. 4 is a block diagram illustrating one possible configuration for a nonvolatile memory device according to embodiments of the inventive concept.
Figure 5:
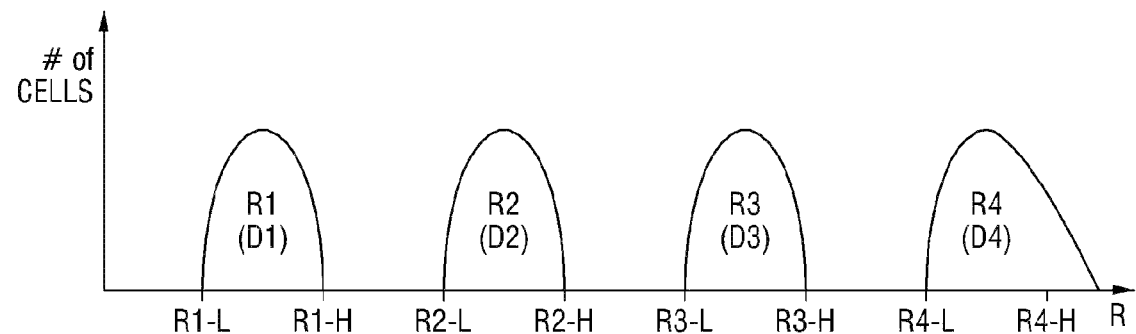
FIG. 5 is a diagram illustrating possible stored data states for memory cells in the nonvolatile memory of FIG. 4.

FIG. 4 is a block diagram illustrating one possible configuration for a nonvolatile memory device according to embodiments of the inventive concept. FIG. 5 is a conceptual diagram illustrating four (4) data states that may be selectively written to each memory cell of the nonvolatile memory device of FIG. 4.

Referring to FIG. 4, a nonvolatile memory device 10 comprises a memory cell array 20, a row decoder 30, a column decoder 40, a controller 50, and a data buffer 54.

The memory cell array 20 includes a plurality of bit lines BL1-1 to BLn-1, where "n" is a natural number, a plurality of word lines WL1-1 to WLm-1, where "m" is a natural number, and a plurality of resistive memory cells MC. Each of the resistive memory cells MC uses a resistance value to store data. For example, a resistive memory cell MC written to have a high resistance value may be interpreted as a data value of "1", and a resistive memory cell MC written to have a low resistance value may be interpreted to have a data vale of 0.

It is assumed in the illustrated embodiment of FIG. 4 that each of the resistive memory cells MC includes a resistive memory element B, and an access element A controlling the flow of current through the resistive memory element B. The resistive memory element B may be alternately referred to as a memory cell or a memory material.

In one more specific embodiment of the inventive concept, the nonvolatile memory device 10 is further assumed to be a phase-change random access memory (PRAM).

The PRAM, which may be referred to as a PCRAM or an ovonic unified memory (OUM), may be configured to use a phase change material, for example, chalcogenide alloy, as resistive element B. In such cases, the resistive memory element B may also be referred to as a chalcogenide element. The phase change material will exhibit a different resistance according to a crystalline state or an amorphous state. For example, the phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$.

The access element A, which may also be referred to as an isolation device, may be embodied in a diode type, a metal-oxide-semiconductor field effect transistor (MOSFET) type or a bipolar junction transistor (BJT) type. Throughout the specification, for simplicity of explanation, a diode type access element A is assumed, but embodiments of the inventive concept are not limited thereto.

It should be noted that in certain embodiments of the inventive concept, each resistive memory cell MC may be a multi-level memory cell. Specifically, the resistive memory cell MC may store three or more bits of data in accordance with respective resistance levels of a resistive memory element B of a resistive memory cell. FIG. 5 illustrates a range of memory cell resistance distributions (R1 to R4), respectively corresponding to four data states (D1 to D4).

Referring to FIG. 5, when the resistance of a resistive memory element B falls within a first distribution (e.g., R1-L≤R1≤R1-H), the resistive memory cell MC will be interpreted as storing first data state D1. When the resistance of a resistive memory element B falls within a second level (R2-L≤R2≤R2-H), the resistive memory cell MC will be interpreted as storing second data D2. When the resistance of the resistive memory element B falls within a third level (R3-L≤R3≤R3-H), the resistive memory cell MC will be interpreted as storing third data D3, and when the resistance level of the resistive memory element B falls within a fourth level (R4-L≤R4), the resistive memory cell MC will be interpreted as storing fourth data D4.

Thus, the resistive memory cell MC may store one of four different data states D1 through D4 according to a corresponding resistance for the resistive memory element B. Of course, the illustrated example of FIG. 5 assumes a two-bit multi-level memory cell that are configured to be written into one of four data states. Other embodiments of the inventive concept may include three-bit or higher multi-level memory cells that are configured to be written into eight data states, sixteen data states, or more.

The row decoder 30 may be used to decode a row address X-ADD and select one or more word lines (or rows) among the plurality of word lines WL1-1 to WLm-1. The column decoder 40 may be used to decode a column address Y-ADD and select one or more bit lines (or columns) among the plurality of bit lines BL1-1 to BLn-1.

The controller 50 may include a pulse generator 52 capable of generating certain pulsed control signals used to write data to one or more resistive memory cell(s). In certain embodiments of the inventive concept, the pulse generator 52 may be used to generate a "write pulse" having a gradually (or incrementally) increasing and/or decreasing magnitude as will be further described hereafter.

By controlled application of a write pulse signal, the "resistance distribution" for each resistive memory cell may be accurately defined in relation to a given set of data states (e.g., the one shown in FIG. 5). The controller 50 may be used in various control schemes contemplated by embodiments of the inventive concept to increase or decrease a write current iteratively applied during a sequence of "write loops". This process will be described hereafter in some additional detail.

In the illustrated example of FIG. 4, the controller 50 includes a sense amplifier and write driver circuit (SA/WD) 51 including a plurality of sense amplifiers and write drivers (SA/WD) 51-1 to 51-n connected to the respective bit lines BL1-1 to BLn-1. One of the sense amplifier and write driver (SA/WD) 51-1 to 51-n is assumed to be connected to one of the bit lines BL1-1 to BLn-1, but this need not always be the case as will be appreciated by those skilled in the art. According to specific design requirements, the number of bit lines BL1-1 to BLn-1 connected to one sense amplifier and write driver (SA/WD) 51-1 to 51-n may vary. For example, in some other embodiments of the inventive concept, two of the bit lines BL1-1 to BLn-1 may be connected to one of the sense amplifier and write driver (SA/WD) 51-1 to 51-n.

The sense amplifier SA included in the sense amplifier and write driver (SA/WD) 51 senses and amplifies the voltage corresponding to the current output from the resistive memory cell MC through the bit lines BL1-1 to BLn-1 during a read operation or a verify operation, thereby reading data stored in the resistive memory cell MC. The sense amplifier SA may include conventionally understood circuits, such as a pre-charge circuit, discharge circuit, switching circuit, current mirror, voltage comparator, etc.

When the pulse generator 52 generates a write pulse in response to "write data" provide from the data buffer 54, the write driver (WD) included in the sense amplifier and write driver (SA/WD) 51 may be used to provide the write pulse to a selected resistive memory cell MC via one of the bit lines BL1-1 to BLn-1.

The data buffer 54 may be used during exchanges of write data or read data between the controller 50 and a host (not shown).

According to certain embodiments of the inventive concept, controller 50 may be used to control write operations directed to one or more resistive memory cell(s) MC. Each write operation may change the stored data state of a resistive memory cell MC in accordance with the write data being written.

For example, when one or more data value (s), hereafter referred to as "first data type", is to be written to a resistive memory cell MC, the controller 50 in certain embodiments of the inventive concept will cause both "a first write pulse" having a gradually increasing magnitude, and "a second write pulse" having a gradually decreasing magnitude to be appropriately generated and then applied to signal lines associated with the resistive memory cell MC. Thus, when a data value (having a corresponding resistive state) is identified in write data corresponds to defined "first data type", a combination of the first and second write pulses will be used to write the first data type to the resistive memory cell MC. However, one or more other data values, hereafter referred to as "second data" is to be written to the resistive memory cell MC, the controller 50 will cause only one of the first and second pulses to be appropriately generated and applied to the signal lines associated with the resistive memory cell MC. Thus, certain writing methods consistent with embodiments of the inventive concept apply both an "up write pulse signal" (i.e., an incrementally increasing write pulse signal) and a "down write pulse signal" (i.e., an incrementally decreasing write pulse signal) to a resistive memory cell MC. The combined application of both the up write pulse signal and the down write pulse signal will hereafter be referred to as a up/down write pulse signal, regardless of whether the up write pulse signal is first applied or not.

Exemplary writing methods that may be used to write data to nonvolatile resistive memory device according to embodiments of the inventive concept will be described with collective reference to FIGS. 4, 5, 6, 7 and 8.

Figure 6:
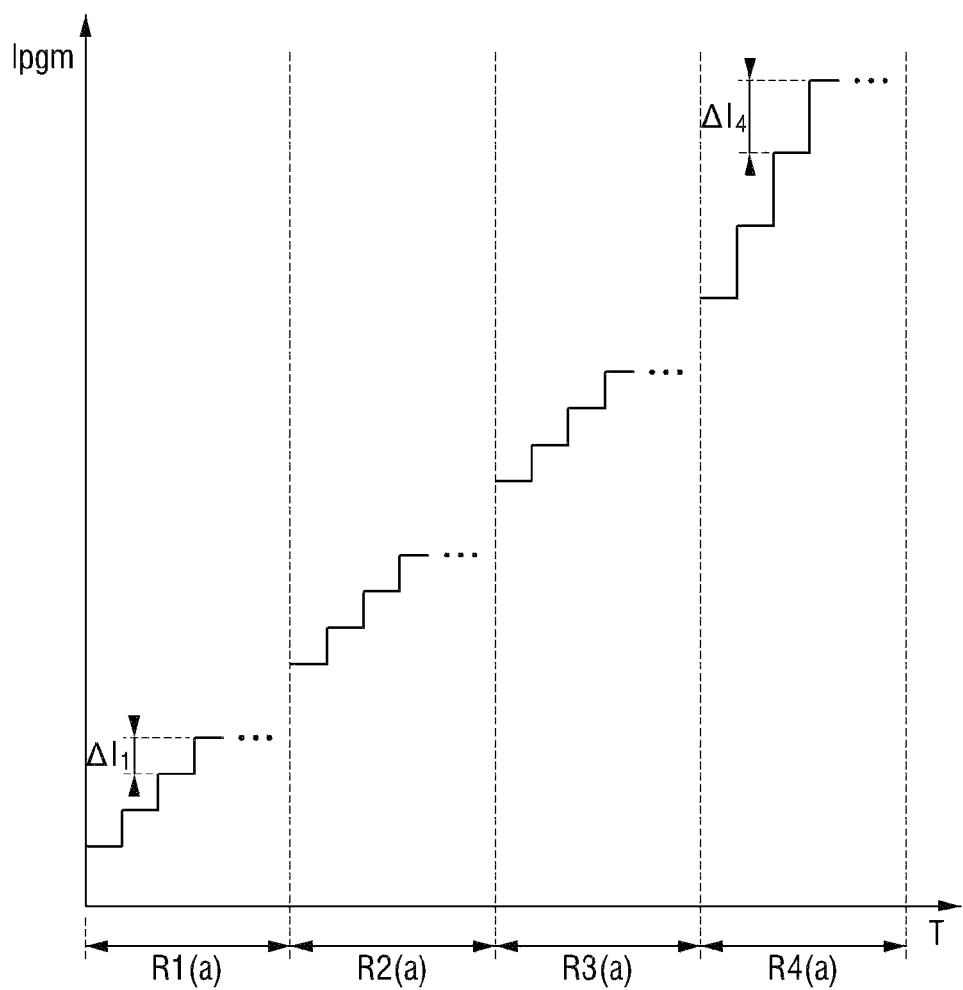
FIGS. 6, 7 and 8 are related diagrams illustrating a driving method for a nonvolatile memory device according to an embodiment of the inventive concept.
Figure 8:
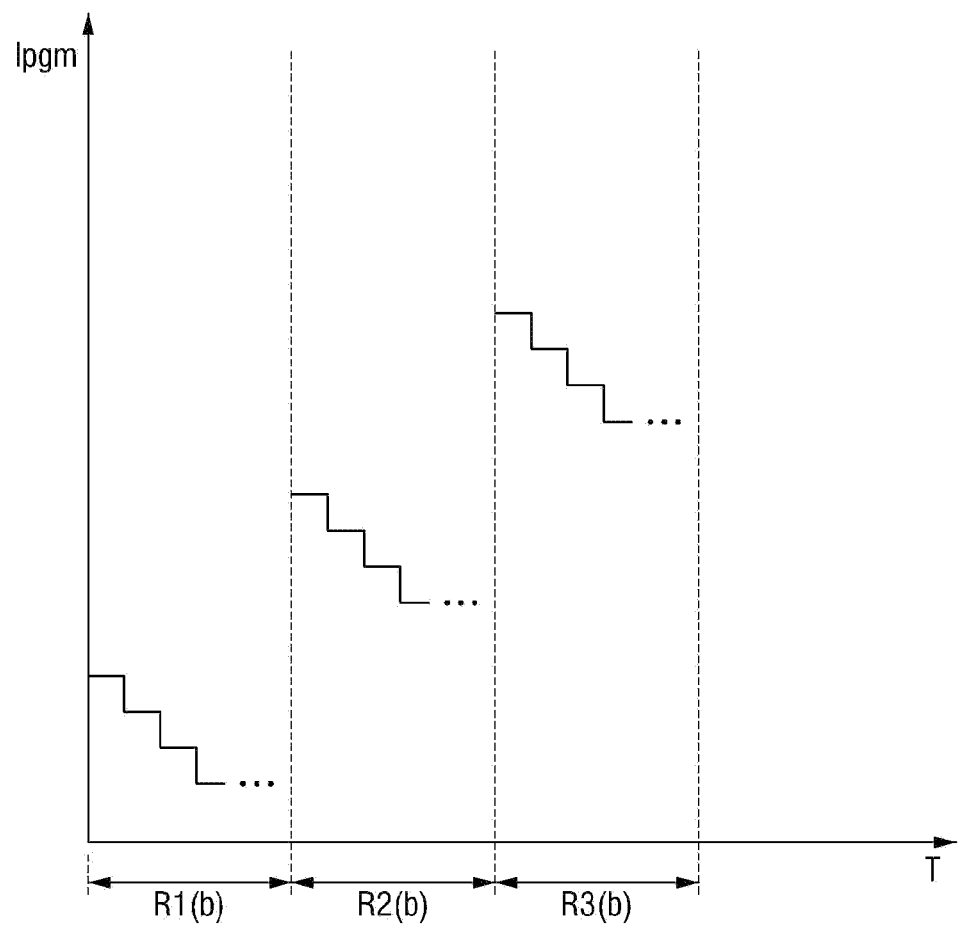

FIG. 6 illustrates an up write pulse signal that may be applied during a writing method directed to a nonvolatile resistive memory device according to an embodiment of the inventive concept. FIG. 8 illustrates a down write pulse signal that may be applied during a writing method directed to a nonvolatile resistive memory device according to an embodiment of the inventive concept Referring to FIG. 4 and FIG. 6, the controller 50 causes an up write pulse signal to be applied in order to store data having any one of the first data state D1, second data state D2, third data state D3, and fourth data state D4. Note that the magnitude of the up write pulse signal gradually increases in its iterative application to a resistive memory cell MC until a first resistance value R1, a second resistance value R2, a third resistance value R3, and a fourth resistance value R4 is established. (See, FIG. 5 with FIG. 6).

Figure 7:
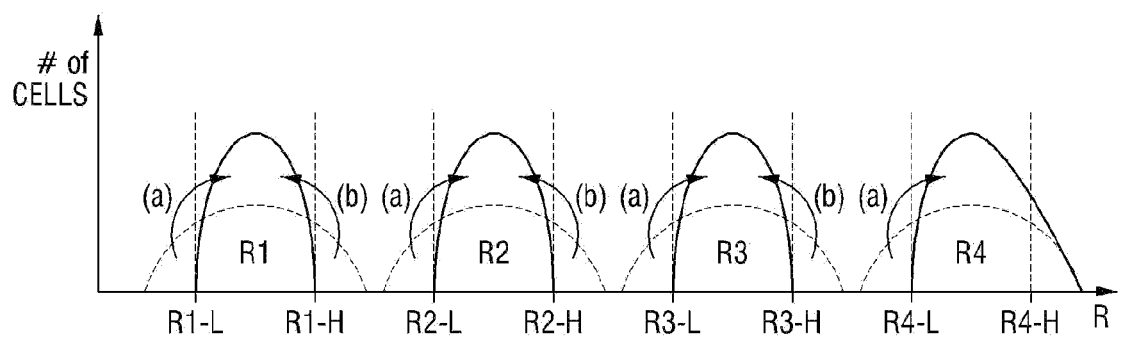

Referring to the conceptual diagram of resistance distributions (R1 through R4) shown in FIG. 7, the application of respective up write pulse signals in relation to the four (4) data states during respective periods "(a)" causes a left-side narrowing (indicated by arrows) of the resistance distribution fields. In other words, application of the respective up write pulse signals corrects undesired broadening of the various resistance distributions beyond their established lower limits (R1-L, R2-L, R3-L and R4-L). This effect is sought to preserve read margin between adjacent data states, and enables later, coherent reading of the stored data. Indeed, application of the up write pulse signal may continue through a number of iterative writing loops, until a desired resistance value for the resistive memory cells MC falls within a corresponding one of the first, second, third, or fourth resistance values R1. R2, R3 and R4.

Referring now to FIGS. 4 and 8, the controller causes a down write pulse signal to be applied in order to store write data having any one of the first data state D1, the second data state D2, and the third data state D3, but not the fourth data state D4. Note that the magnitude of the down write pulse signal gradually decreases in its iterative application to a resistive memory cell MC until the first resistance value R1, second resistance value R2, third resistance value R3, and fourth resistance value R4 is established. (See, FIG. 5 with FIG. 8).

Referring again to the conceptual diagram of resistance distributions (R1 through R4) shown in FIG. 7, the application of respective down write pulse signals in relation to the four (4) data states during respective periods "(b)" causes a right-side narrowing (indicated by arrows) of the resistance distribution fields. In other words, application of the respective down write pulse signals corrects undesired broadening of the various resistance distributions beyond their established upper limits (R1-H, R2-H, and R3-H). Again, this effect is sought to preserve read margin between adjacent data states, and enables later, coherent reading of the stored data. Indeed, application of the down write pulse signal may continue through a number of iterative writing loops, until a desired resistance value for the resistive memory cells MC falls within a corresponding one of the first, second, or third resistance values R1, R2 and R3.

Taken in combination, the application of an up/down write pulse signal may be used during a writing operation to store data in correct relation to defined resistance distributions (R1, R2 and R3) for the resistive memory cell MC, as illustrated in FIG. 5 for example. At least this is the case for "first type data"—here being defined as including the first data state D1, second data state D2 and third data state D3.

As a result of applying the up/down write pulse signal, when the resistance of the resistive memory cell MC is determined to fall within the distribution (R1-L≤R1≤R1-H), the resistive memory cell MC is interpreted as storing the first data state D1 (e.g., a data value of "00" or "11"). When the resistance of the resistive memory cell MC is determined to fall within the distribution (R2-L≤R2≤R2-H), the resistive memory cell MC is interpreted as storing the second data state D2 (e.g., a data value of "10" or "01"). When the resistance of the resistive memory cell MC is determined to fall within the distribution (R3-L≤R3≤R3-H), the resistive memory cell MC is interpreted as storing the third data state D3 (e.g., "01" or "10"), and when the resistance of the resistive memory cell MC is determined to exceed the fourth lower limit (R4-L≤R4), the resistive memory cell MC is interpreted as storing the fourth data state D4 (e.g., a data value of "11" or "00").

As described above, during a writing method according to embodiments of inventive concept, an up/down write pulse signal may be used to accurately define the resistance of a resistive memory cell MC, such that it falls within one of first, second, or third resistance distributions (e.g., R1, R2 and R3). The data values associated with these resistance distributions are each denoted as first data type. In contrast, during a writing method according to embodiments of inventive concept, only an up write pulse signal need be used to acceptably define the resistance of a resistive memory cell MC, such that it falls within the fourth resistance distributions (e.g., R4). The particular data value associated with (e.g.,) the highest resistance distribution is denoted as a second data type.

In the foregoing, the data state of the resistive memory cell MC is acceptably defined using only the up write pulse signal since all detected resistance values greater than the lower limit (R4-L) for the fourth resistance distribution (R4) will be interpreted as storing the fourth data state D4. No "narrowing" of the upper portion of the fourth resistive distribution is necessary and is this omitted to improve the speed of write operations.

Referring back to FIG. 6, a first step increase ($\Delta I_1$) in the up write pulse signal may be used when data states D1, D2 and D3 are written to the resistive memory cell MC, whereas a second step increase ($\Delta I_1$), larger than the first step increase ($\Delta I_1$), may be used when the data state D4 is written to the resistive memory cell MC. This approach further refines the accuracy with which the resistance of a resistive memory cell MC may be defined in relation to the lower three (3) data states D1, D2 and D3, while intelligently sacrificing a bit of accuracy with which the resistance of a resistive memory cell MC may be defined in relation to highest data state D4 in order to improve the speed of the overall write operation. Given the unique interpretation of data state related to the highest resistance distribution, the use of a larger (and therefore potentially less accurate) "step increase" during the data writing method does not impair data writing accuracy. Accordingly, as shown in FIG. 7, the resistance distribution R4 associated with the fourth data state D4 may be more rapidly and sharply narrowed than the respective resistive distributions R1, R2 and R3 associated with the first, second and third data states D1, D2 and D3.

Another data writing method that may be used to write data to a nonvolatile memory device according to embodiments of the inventive concept will be described with reference to FIGS. 4, 9 and 10.

Figure 9:
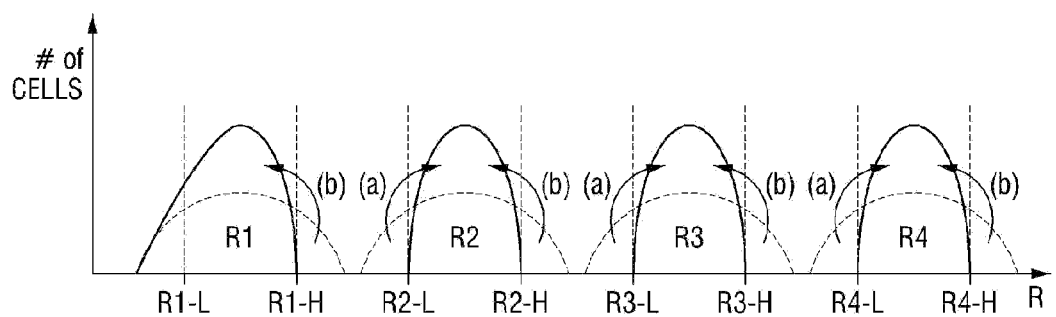
FIGS. 9 and 10 are related diagrams illustrating another driving method for a nonvolatile memory device according to an embodiment of the inventive concept.
Figure 10:
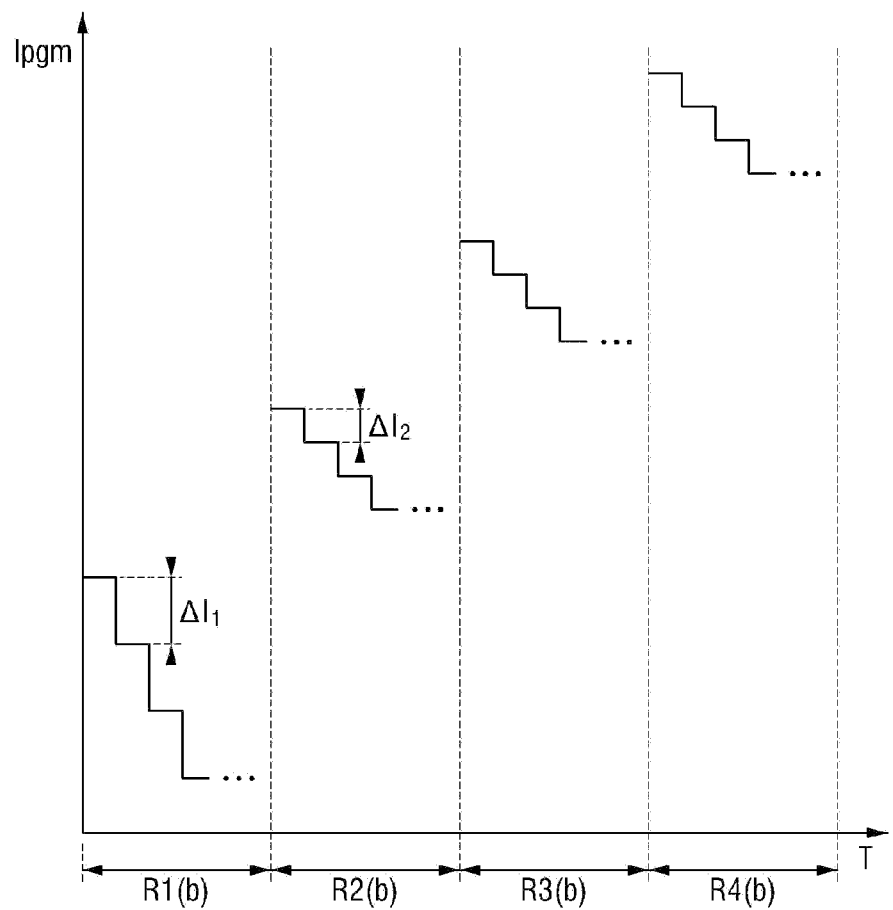

Again assuming the nonvolatile memory device 10 of FIG. 4, and with the predicate description above given in relation to FIGS. 5, 6, 7 and 8, FIGS. 9 and 10 may be understood as being analogous to FIGS. 7 and 8, except however, the principles applied to the up write pulse signal of FIG. 6 and the highest resistance distribution R4 of FIG. 5 are applied to the down write pulse signal of FIG. 10 and the lowest resistance distribution R1 of FIG. 9.

Referring to FIG. 9, it should be noted that any resistance exhibited by a resistance memory cell that is less than the upper limit (R1-H) of the first resistance distribution R1 will be interpreted as the data state D1. Accordingly, the approach taken above to a more rapid writing of data corresponding to a highest resistance distribution may be applied to a more rapid writing of data corresponding to a lowest resistance distribution with all the attendant benefits.

A first step decrease ($\Delta I_1$) in the down write pulse signal may be used when the data state D1 is written to the resistive memory cell MC, whereas a second step decrease ($\Delta I_1$), smaller than the first step decrease ($\Delta I_1$), may be used when any one of the data states D2, D3 and D4 is written to the resistive memory cell MC. This approach further refines the accuracy with which the resistance of a resistive memory cell MC may be defined in relation to the upper three (3) data states D2, D3 and D4, while intelligently sacrificing a bit of accuracy with which the resistance of a resistive memory cell MC may be defined in relation to lowest data state D1 in order to improve the speed of the overall write operation. Given the unique interpretation of data state related to the lowest resistance distribution, the use of a larger (and therefore potentially less accurate) "step decrease" during the writing method does not impair data writing accuracy.

As described above, according to the present embodiment, the operation of applying the first write pulse whose magnitude gradually increases to the resistive memory cell MC having the smallest resistance value R1 is skipped. As described above, if only the resistive memory cell MC needed to have the smallest resistance value, i.e., the first resistance value R1, had R1-H or less, it can be determined that the first data D1 is stored in the resistive memory cell MC because there is no resistive memory cell MC having a resistance value smaller than the first resistance value R1. Therefore, according to the present embodiment, the operation of applying the first write pulse whose magnitude gradually increases to the resistive memory cell MC having the smallest resistance value R1 is skipped, thereby increasing the writing speed of the nonvolatile memory device 10.

Next, a write operation of a nonvolatile memory device according to still another exemplary embodiment of the inventive concept will be described with reference to FIGS. 4 and 11.

Figure 11:
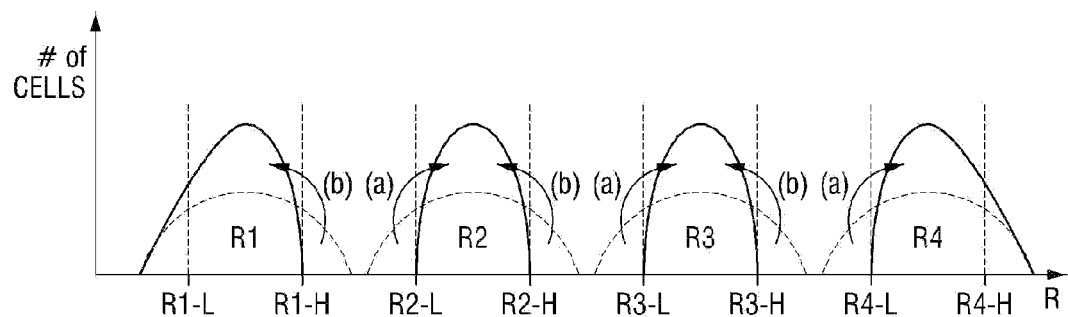
FIG. 11 is a diagram illustrating a driving method of a nonvolatile memory device according to still another exemplary embodiment of the inventive concept.

FIG. 11 is a diagram illustrating a writing method for a nonvolatile memory device according to embodiments of the inventive concept. Drawing upon the foregoing, those skilled in the art will understand that the principles and corresponding benefits of the embodiments described in relation to FIGS. 4-10 may be combined in a write method that recognizes opportunities to improve writing speed in relation to a lowest and a highest resistance distribution. Thus, an up/down write pulse signal would be used to write a "first data type" including the second and third data states corresponding respectively to second and third (collectively "intermediate") resistance distributions. In contrast, only an up write pulse signal would be used to write a "second data type" including only the fourth data state corresponding to the fourth (highest) resistance distribution, and only a down write pulse signal would be used to write a "third data type" including only the first data state corresponding to the first (lowest) resistance distribution.

Figure 12:
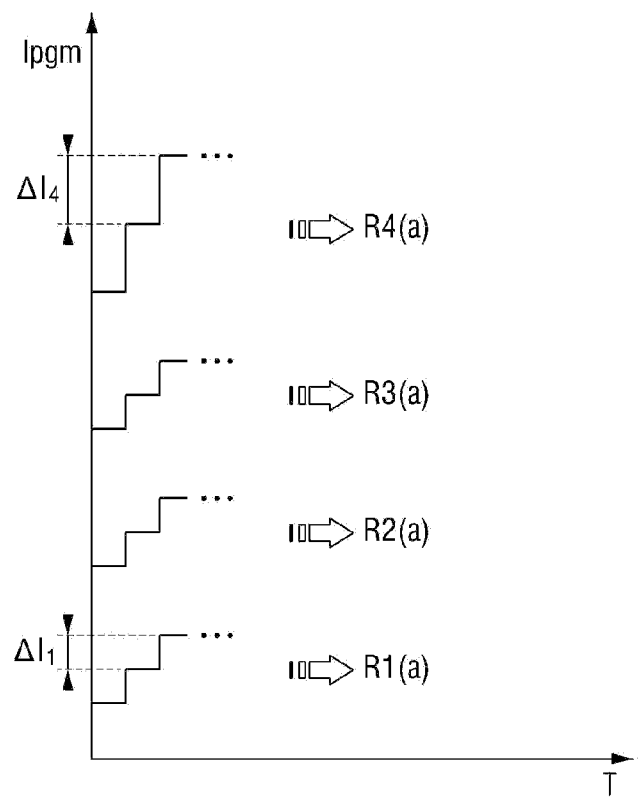
FIG. 12 is a diagram illustrating a driving method of a nonvolatile memory device according to still another exemplary embodiment of the inventive concept.

FIG. 12 is a conceptual diagram further illustrating a writing method for a nonvolatile memory device according to embodiments of the inventive concept.

Referring to FIG. 12, in order to store first to fourth data D1 to D4, the controller 50 may concurrently apply up write pulse signals to resistive memory cells in order to place the resistance of the resistive memory cells into one of the first to fourth resistance distributions R1 to R4, unlike the embodiment of FIG. 6 wherein an up write pulse signal was sequentially applied to each one of a group of resistive memory cells.

FIGS. 13, 14, 15, 16 and 17 are respective diagrams illustrating memory systems according to embodiments of the inventive concept. Specifically, FIGS. 13 through 17 illustrate memory systems using nonvolatile memory devices according to embodiments of the inventive concept, such as the embodiments described above.

Figure 13:
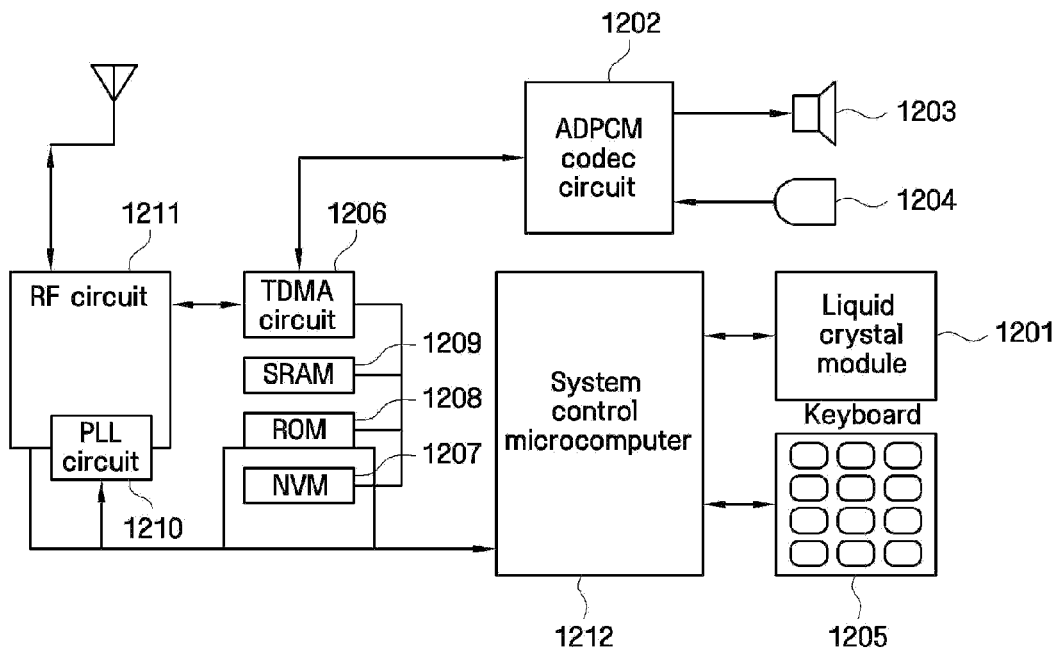
FIGS. 13 to 17 are diagrams illustrating memory systems according to exemplary embodiments of the inventive concept.

FIG. 13 is a diagram illustrating a cellular phone system which uses nonvolatile memory devices according to embodiments of the inventive concept.

Referring to FIG. 13, the cellular phone system includes a liquid crystal module 1201, an adaptive differential pulse code modulation (ADPCM) codec circuit 1202 which compresses sound and/or decompresses compressed sound, a speaker 1203, a microphone 1204, a keypad 1205, a time division multiple access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. The nonvolatile memory device 1207 may be any nonvolatile memory device according the inventive concept such as the exemplary embodiments described above, and may store, for example, an identification (ID) number. The ROM 1208 may store programs, and the SRAM 1209 may serve as a work area for a system control microcomputer 1212 or temporarily store data. The system control microcomputer 1212 is a processor and may control the write operation and read operation of the nonvolatile memory device 1207.

Figure 14:
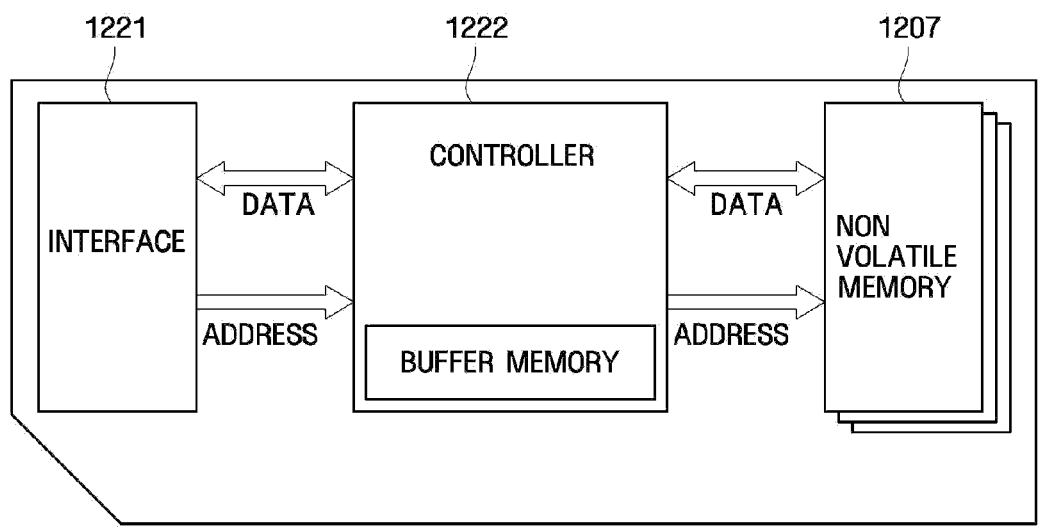

FIG. 14 is a diagram illustrating a memory card which uses nonvolatile memory devices according to embodiments of the inventive concept. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 14, the memory card may include an interface 1221 which interfaces with an external device, a controller 1222 which includes a buffer memory and controls the operation of the memory card, and one or more nonvolatile memory devices 1207 according to exemplary embodiments of the inventive concept. The controller 1222 is a processor and may control the write and read operations of the nonvolatile memory devices 1207. Specifically, the controller 1222 is coupled to interface 1221 and each of the nonvolatile memory devices 1207 by a data bus DATA and an address bus ADDRESS.

Figure 15:
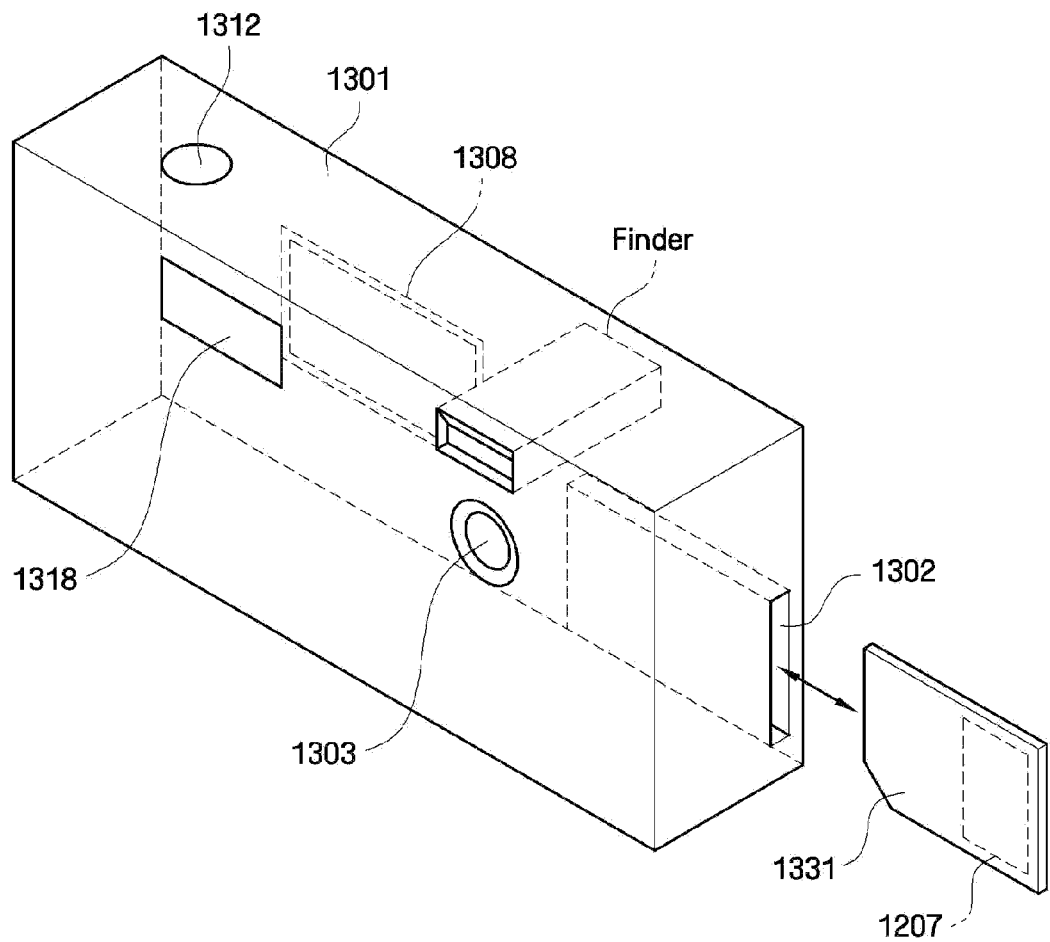

FIG. 15 is a diagram illustrating a digital still camera which uses nonvolatile memory devices according to embodiments of the inventive concept.

Referring to FIG. 15, the digital still camera includes a body 1301, a slot 1302, a lens 1303, a display 1308, a shutter button 1312, and a strobe 1318. In particular, a memory card 1331 may be inserted into slot 1302 and include one or more nonvolatile memory devices 1207 according to embodiments of the inventive concept. If memory card 1331 is of a contact type, it electrically contacts a specified electrical circuit on a circuit board when it is inserted into slot 1302. If memory card 1331 is of a non-contact type, it communicates with the digital still camera using a wireless signal.

Figure 16:
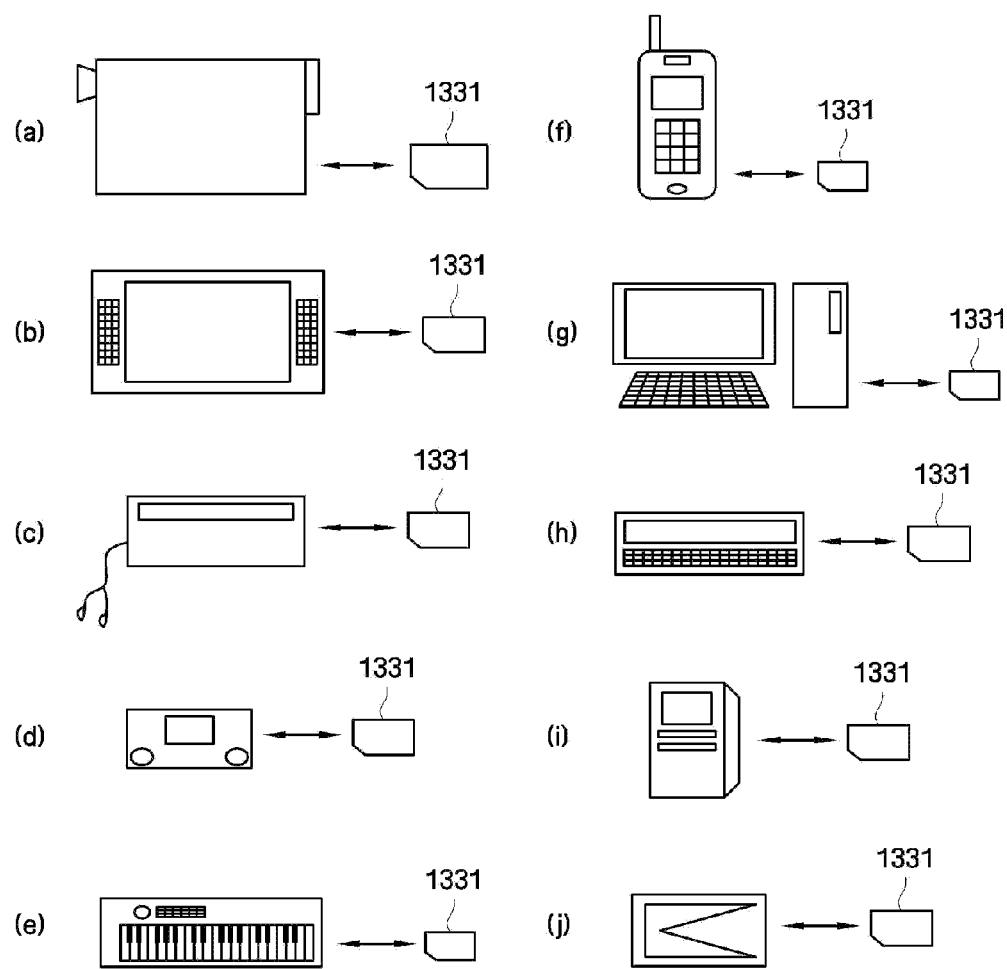

FIG. 16, inclusive of FIGS. 16(a) through 16(j) is a diagram illustrating various systems capable of using the memory card of FIG. 14.

Referring to FIG. 16, a memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 17:
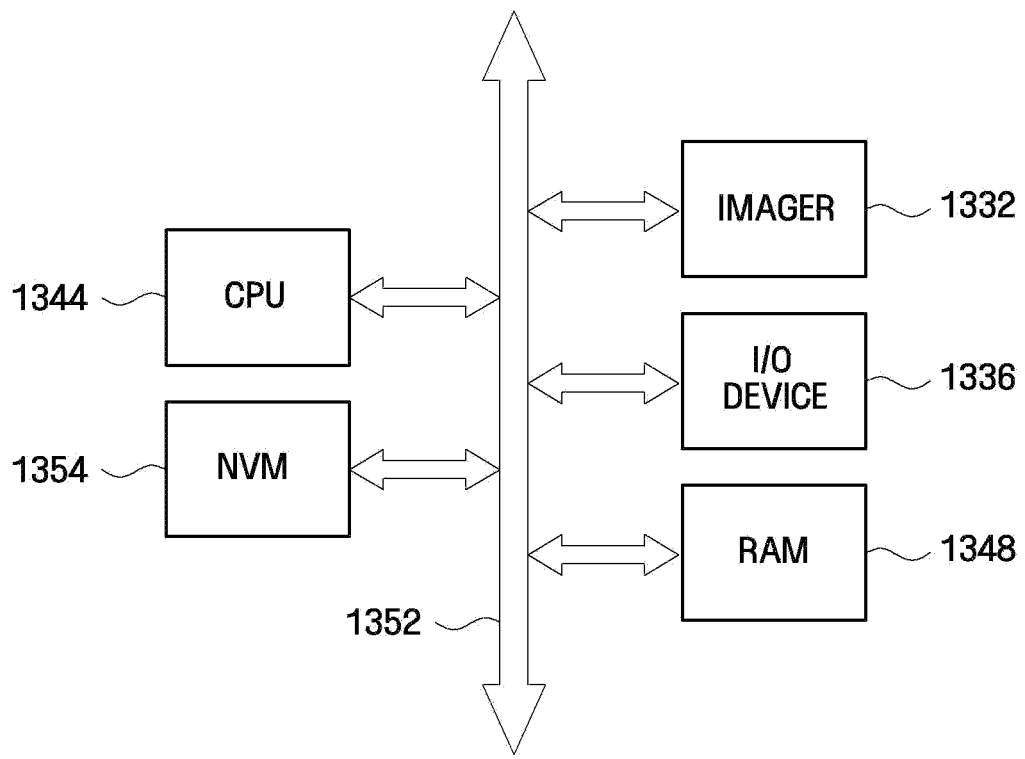

FIG. 17 is a diagram illustrating an image sensor system which uses nonvolatile memory devices according to embodiments of the inventive concept.

Referring to FIG. 17, the image sensor system may include an imager 1332, an input/output device 1336, a random access memory (RAM) 1348, a central processing unit (CPU) 1344, and a nonvolatile memory device 1354 according to exemplary embodiments of the inventive concept. These components, i.e., imager 1332, input/output device 1336, RAM 1348, CPU 1344, and nonvolatile memory device 1354 communicate with each other using a bus 1352. Imager 1332 may include a photo sensing element such as a photogate or a photodiode. Each of the above components and a processor may be implemented as a single chip or separate chips.

Figure 18:
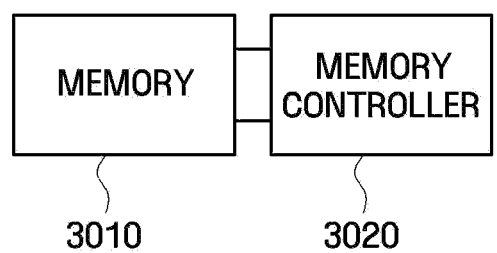
FIG. 18 is a block diagram of a memory system which uses nonvolatile memory devices according to exemplary embodiments of the inventive concept.

FIG. 18 is a general block diagram of a memory system capable of incorporating one or more nonvolatile memory devices according to embodiments of the inventive concept.

Referring to FIG. 18, a memory 3010 is coupled to a memory controller 3020. The memory 3010 may be any of the nonvolatile memory device embodiments described above. The memory controller 3020 supplies input signals for controlling operation of the memory 3010. For example, the memory controller 3020 supplies a command CMD and address signals. The memory controller 3020 may include a memory interface, a host interface, an error correction code (ECC) circuit, a CPU, and a buffer memory. The memory interface provides data transmitted from the buffer memory to memory 3010 or transmits data read out of the memory 3010 to the buffer memory. Also, the memory interface may provide a command or an address transmitted from an external host to the memory 3010.

The host interface may communicate with an external host through a universal serial bus (USB), small computer system interface (SCSI), peripheral component interconnect (PCI) express, AT attachment (ATA), parallel ATA (PATA), serial ATA (SATA), or serial attached SCSI (SAS) interface, for example.

A memory system according to embodiments of the inventive concept may include an ECC circuit, which generates a parity bit using data transmitted to the memory 3010. The generated parity bit may be stored in a specific area of the memory 3010, together with data. The ECC circuit detects an error of data read out of the memory 3010. If the detected error is within a correction range, the ECC circuit corrects the detected error. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. In addition, the buffer memory may store meta data or cache data to be stored in the memory 3010. During a sudden power-off operation, meta data or cache data stored in the buffer memory may be stored in the memory 3010. The buffer memory may be a dynamic random access memory (DRAM) and a static random access memory (SRAM).

Figure 19:
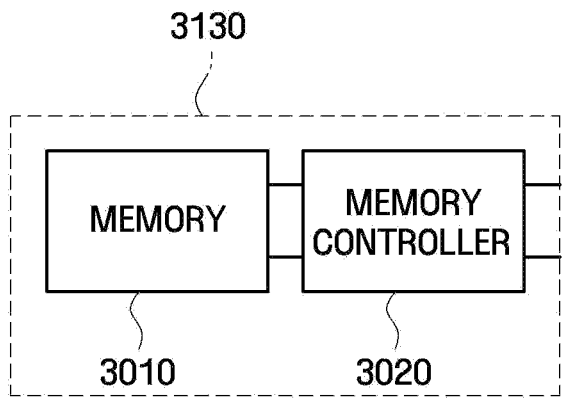
FIG. 19 is a block diagram of a memory system which uses nonvolatile memory devices according to another exemplary embodiment of the inventive concept.

FIG. 19 is a general block diagram of a memory system capable of incorporating one or more nonvolatile memory devices according to embodiments of the inventive concept. This memory system is the same as the memory system of FIG. 18, except that a memory 3010 and a memory controller 3020 are embedded in a card 3130. For example, the card 3130 may be a flash memory card. That is, the card 3130 may be a card meeting any industry standard for use with a consumer electronics device such as a digital camera, a personal computer, etc. It will be appreciated that the memory controller 3020 may control the memory 3010 based on controls signals received by card 3130 from another device (e.g., external device).

Figure 20:
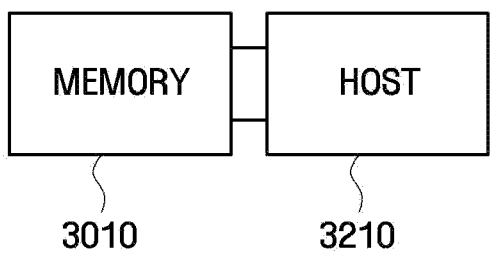
FIG. 20 is a block diagram of a memory system which uses nonvolatile memory devices according to still another exemplary embodiment of the inventive concept.

FIG. 20 is a general block diagram of a memory system capable of incorporating one or more nonvolatile memory devices according to embodiments of the inventive concept. Referring to FIG. 20, a memory 3010 may be coupled to a host system 3210. The host system 3210 may be a processing system such as a personal computer, a digital camera, etc. The host system 3210 may use the memory 3010 as an erasable storage medium. As described above, the host system 3210 supplies input signals for controlling operation of the memory 3010. For example, the host system 3210 supplies a command CMD and address signals.

Figure 21:
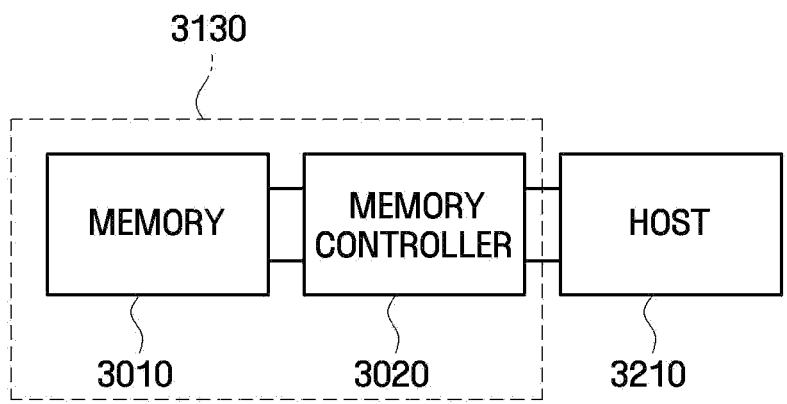
FIG. 21 is a block diagram of a memory system which uses nonvolatile memory devices according to still another exemplary embodiment of the inventive concept.

FIG. 21 is a general block diagram of a memory system capable of incorporating one or more nonvolatile memory devices according to embodiments of the inventive concept. Referring to FIG. 21, a host system 3210 is coupled to a card 3130. In this embodiment, the host system 3210 transmits control signals to the card 3130 such that the memory controller 3020 controls operation of a memory 3010.

Figure 22:
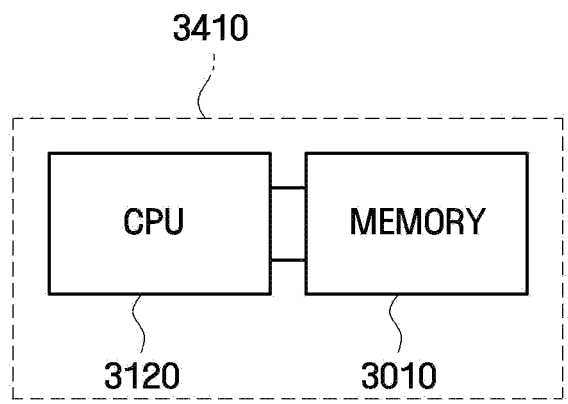
FIG. 22 is a block diagram of a memory system which uses nonvolatile memory devices according to still another exemplary embodiment of the inventive concept.

FIG. 22 is a general block diagram of a memory system capable of incorporating one or more nonvolatile memory devices according to embodiments of the inventive concept. Referring to FIG. 22, a memory 3010 is connected to a CPU 3120 within a computer system 3410. For example, the computer system 3410 may be a personal computer, PDA, etc. The memory 3010 may be connected to the CPU 3120 directly or via a bus, etc.

A nonvolatile memory device according to exemplary embodiments of the inventive concept may be used as a storage class memory (SCM), which is the general concept of memories capable of simultaneously providing nonvolatile characteristics and access characteristics. The SCM may be utilized as not only a data storage space but also a program performing space.

The above-described PRAM, RRAM, FRAM, and magnetic RAM (MRAM) may be appropriate examples of an SCM. The SCM may be used as not only a data storage memory instead of a flash memory but also a main memory instead of an SRAM. Moreover, one SCM may be used instead of a flash memory and an SRAM.

Figure 23:
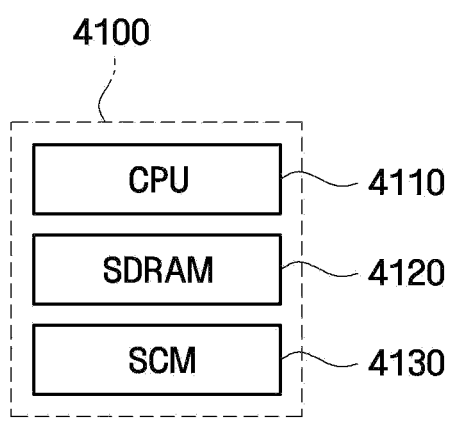
FIG. 23 is a block diagram of an exemplary memory system which uses SCM.

FIG. 23 is a block diagram of a memory system 4100 capable of incorporating a SCM. Referring to FIG. 23, the memory system 4100 includes a CPU 4110, a synchronous DRAM (SDRAM) 4120, and an SCM 4130 used instead of a flash memory.

In the memory system 4100, a data access speed of the SCM 4130 may be greater than that of a flash memory. For example, under a PC environment where CPU 4110 runs at 4 GHz, data access speed of a PRAM which is a kind of SCM 4130 may be about 32 times greater than that of a flash memory. Thus, the memory system 4100 equipped with SCM 4130 may attain higher-speed access gain than a memory system equipped with a flash memory.

Figure 24:
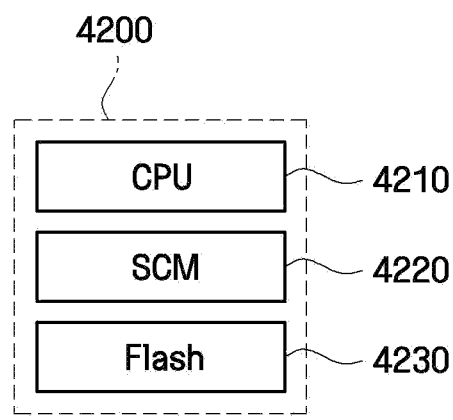
FIG. 24 is a block diagram of another exemplary memory system which uses SCM.

FIG. 24 is a block diagram of a memory system 4200 capable of incorporating a SCM. Referring to FIG. 24, the memory system 4200 includes a CPU 4210, an SCM 4220 used instead of an SDRAM, and a flash memory 4230.

In the memory system 4200, power dissipation of the SCM 4220 is less than that of an SDRAM. Energy dissipated by the main memory of a computer system may be about 40% of total energy. Therefore, many efforts have been intensively made to reduce power dissipation of the main memory. The SCM may reduce dynamic energy dissipation by an average of as much as about 53% and reduce energy dissipation caused by power leakage by an average of as much as about 73%. As a result, the memory system 4200 equipped with the SCM 4220 may allow power dissipation to be reduced compared to a memory system equipped with an SDRAM.

Figure 25:
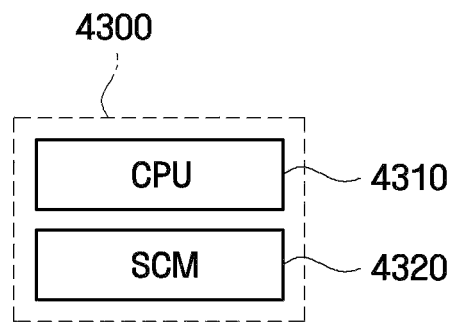
FIG. 25 is a block diagram of still another exemplary memory system which uses SCM.

FIG. 25 is a block diagram of a memory system 4300 capable of incorporating a SCM. Referring to FIG. 25, the memory system 4300 includes a CPU 4310 and an SCM 4320. The SCM 4320 is used as a main memory instated of an SDRAM and as a data storage memory instead of a flash memory. The memory system 4300 is advantageous in data access speed, low power, space utilization, and cost.

While the inventive concept has been particularly shown and described with reference to certain embodiments thereof, it will be understood by those of ordinary skill in the art that various changes in form and details may be made therein without departing from the scope of the inventive concept as defined by the accompanying claims. It is therefore desired that the embodiments be considered in all respects as illustrative and not restrictive, reference being made to the appended claims rather than the foregoing description to indicate the scope of the inventive concept.

What is claimed is:

1. A writing method for a resistive nonvolatile memory device, comprising:
    writing data to at least one resistive nonvolatile memory cell using an up/down write pulse signal applied to a bit line of the at least one resistive nonvolatile memory cell when the data is first data type, the up/down write pulse signal comprising both an up write pulse signal and a down write pulse signal; and
    writing data to the at least one resistive nonvolatile memory cell using only one of the up write pulse signal and the down write pulse signal applied to the bit line of the at least one resistive nonvolatile memory cell when the data is second data type.

2. The method of claim 1, wherein each one of the at least one resistive memory cell is configured to store a first data state corresponding to a lowest resistance distribution, a second data state corresponding to a second resistance distribution greater than the lowest resistance distribution, a third data state corresponding to a third resistance distribution greater than the second resistance distribution, and a fourth data state corresponding to a highest resistance distribution greater than the third resistance distribution.

3. The method of claim 1, wherein each one of the at least one resistive memory cell is a two-bit, resistive nonvolatile memory cell.

4. The method of claim 2, wherein the first data type is data having one of the first data state, the second data state, and the third data state,
    the second data type is data having the fourth data state, and
    only the up write pulse signal is used to write the data when the data is the second data type.

5. The method of claim 4, wherein the up write pulse signal is iteratively applied to the at least one resistive nonvolatile memory cell using a first step increase for each successive iteration when the data is the first data type, and using a second step increase larger than the first step increase for each successive iteration when the data is the second data type.

6. The method of claim 2, wherein the first data type is data having the first data state,
    the second data type is data having one of the second data state, the third data state, and the fourth data state, and
    only the down write pulse signal is used to write the data when the data is the first data type.

7. The method of claim 6, wherein the down write pulse signal is iteratively applied to the at least one resistive nonvolatile memory cell using a first step decrease for each successive iteration when the data is the second data type, and using a second step decrease larger than the first step decrease for each successive iteration when the data is the first data type.

8. The method of claim 1, wherein the at least one resistive nonvolatile memory cell comprises a plurality of resistive nonvolatile memory cells, each one being sequentially written to during the writing method.

9. The method of claim 1, wherein the at least one resistive nonvolatile memory cell comprises a plurality of resistive nonvolatile memory cells being concurrently written to during the writing method.

10. The method of claim 1, wherein the at least one resistive memory cell is a phase-change memory cell.

11. A writing method for a resistive nonvolatile memory device, comprising:
    writing data to at least one resistive nonvolatile memory cell using an up/down write pulse signal applied to a bit line of the at least one resistive nonvolatile memory cell when the data is a first data type, the up/down write pulse signal comprising both an up write pulse signal and a down write pulse signal;
    writing data to the at least one resistive nonvolatile memory cell using only the up write pulse signal applied to the bit line of the at least one resistive nonvolatile memory cell when the data is a second data type; and
    writing data to the at least one resistive nonvolatile memory cell using only the down write pulse signal applied to the bit line of the at least one resistive nonvolatile memory cell when the data is a third data type.

12. The method of claim 11, wherein each one of the at least one resistive memory cell is configured to store a first data state corresponding to a lowest resistance distribution, a second data state corresponding to a second resistance distribution greater than the lowest resistance distribution, a third data state corresponding to a third resistance distribution greater than the second resistance distribution, and a fourth data state corresponding to a highest resistance distribution greater than the third resistance distribution.

13. The method of claim 12, wherein the first data type is data having one of the second data state and the third data state, the second data type is data having the fourth data state, and the third data type is data having the first data state.

14. The method of claim 13, wherein the up write pulse signal is iteratively applied to the at least one resistive nonvolatile memory cell using a first step increase for each successive iteration when the data is the first data type, and using a second step increase larger than the first step increase for each successive iteration when the data is the second data type.

15. The method of claim 13, wherein the down write pulse signal is iteratively applied to the at least one resistive nonvolatile memory cell using a first step decrease for each successive iteration when the data is the first data type, and using a second step decrease larger than the first step decrease for each successive iteration when the data is the third data type.

16. The method of claim 11, wherein the at least one resistive nonvolatile memory cell comprises a plurality of resistive nonvolatile memory cells, each one being sequentially written to during the writing method.

17. The method of claim 11, wherein the at least one resistive nonvolatile memory cell comprises a plurality of resistive nonvolatile memory cells being concurrently written to during the writing method.

18. The method of claim 11, wherein the at least one resistive memory cell is a phase-change memory cell.

19. A memory system writing data, and comprising:

a memory controller providing data to, and controlling operation of a resistive nonvolatile memory device, wherein the resistive nonvolatile memory device is configured to write the data to at least one resistive nonvolatile memory cell in the resistive nonvolatile memory device using an up/down write pulse signal applied to a bit line of the at least one resistive nonvolatile memory cell when the data is a first data type, the up/down write pulse signal comprising both an up write pulse signal and a down write pulse signal, and write data to the at least one resistive nonvolatile memory cell using only one of the up write pulse signal and the down write pulse signal applied to the bit line of the at least one resistive nonvolatile memory cell when the data is a second data type.

20. The memory system of claim 19, wherein the at least one resistive memory cell is a phase-change memory cell.

* * * * *